(12) United States Patent
Godard

(10) Patent No.: US 7,324,006 B2
(45) Date of Patent: Jan. 29, 2008

(54) REMOTE DISPLAY AMMETER FOR POWER PLUG OR POWER STRIP

(75) Inventor: Jean Luc Godard, Glenside, PA (US)

(73) Assignee: The Wiremold Company, West Hartford, CT (US)

( * ) Notice: Subject to any disclaimer, the term of this patent is extended or adjusted under 35 U.S.C. 154(b) by 351 days.

(21) Appl. No.: 10/960,844

(22) Filed: Oct. 7, 2004

(65) Prior Publication Data
US 2005/0101193 A1    May 12, 2005

Related U.S. Application Data

(60) Provisional application No. 60/519,434, filed on Nov. 12, 2003, provisional application No. 60/546,246, filed on Feb. 20, 2004.

(51) Int. Cl.
*G08B 21/00* (2006.01)
*H02H 3/00* (2006.01)

(52) U.S. Cl. ........................ 340/664; 340/635; 361/62; 361/63; 361/64

(58) Field of Classification Search ..................... None
See application file for complete search history.

(56) References Cited

U.S. PATENT DOCUMENTS 6,741,442 B1 * 5/2004 McNally et al. ............ 361/166
7,141,891 B2 * 11/2006 McNally et al. ............... 307/39
2002/0117902 A1 * 8/2002 Evers et al. ................. 307/130
2005/0094336 A1 * 5/2005 Cleveland .................... 361/64

* cited by examiner

*Primary Examiner*—Julie Bichngoc Lieu
(74) *Attorney, Agent, or Firm*—McCormick, Paulding & Huber LLP

(57) ABSTRACT

A power strip is providing including a housing coupled to a first end portion of a power supply cord, the housing having an electrical receptacle mounted thereto and connected to the power supply cord, the power supply cord having a second end connectable to a power source. A current sensor is coupled to the power supply cord between the electrical receptacle and the second end for detecting electrical current flow through the power supply cord and providing an output signal that varies in proportion to the current flow through the power supply cord. A processing circuit coupled to the output of the current sensor includes a display device for displaying at least one of the current, voltage, power, and phase associated with the power supply cord at the current sensor. The display device can be remotely coupled to the power strip for positioning the display in a convenient location.

29 Claims, 8 Drawing Sheets

Page 1 — US 7,324,006 B2

REMOTE DISPLAY AMMETER FOR POWER PLUG OR POWER STRIP

CROSS REFERENCE TO RELATED APPLICATIONS

This application claims priority to U.S. Provisional Patent Application No. 60/519,434 filed on Nov. 12, 2003 entitled "Cabinet Mounting For Power Strip" and U.S. Provisional Patent Application No. 60/546,246 filed on Feb. 20, 2004 entitled "Remote Readout for Power Plug or Power Strip". The disclosure of each of the above-identified provisional applications is incorporated herein by reference.

FIELD OF THE INVENTION

The present invention generally relates to power strips and power cords and more particularly to a power strip and power cord including a remote display ammeter.

BACKGROUND OF THE INVENTION

Electronic cabinets generally are provided with power strips built into the cabinet for ease in plugging in electronic equipment provided within the cabinet. Typically, such power strips are permanently mounted on the back of the cabinet which makes the power strip accessible from the rear of the cabinet, the cabinet typically being provided with a rear door for this purpose. In use, such conventional installations sometimes make it awkward to reach the power strip for purposes of plugging and unplugging equipment to the outlets provided in the power strip, and for checking the status of the power input to the cabinet itself. The power strips generally provide for circuit protection as a result of one or more circuit breakers mounted in the power strip.

In other applications, such as machinery or large appliances, power cords are usually located at the rear of or lower portion of the appliances or machines being powered such that access to the power cord for monitoring the status of the current or power usage is often limited.

Based on the foregoing, it is the general object of the present invention to provide a power strip or power cord that improves upon, or overcomes the problems and drawbacks associated with prior art devices.

SUMMARY OF THE INVENTION

The present invention provides a power strip including a housing coupled to a first end portion of a power supply cord, the housing having an electrical receptacle mounted thereto and electrically connected to the first end portion of the power supply cord, the power supply cord having a second end connectable to a power source. Typically, the second end of the power supply cord includes an attached male plug for connecting the power strip to an electrical outlet or a power cord.

A current sensor is coupled to the first end portion of the power supply cord between the at least one electrical receptacle and the second end, the current sensor for detecting electrical current flow through the power supply cord. The current sensor providing an output that varies in proportion to the current flow through the power supply cord.

A processing circuit is coupled to the output of the current sensor for converting an output voltage of the current sensor to a DC voltage proportional to the electrical current flow detected in the power supply cord. A display device is coupled to the processing circuit for displaying one of the current, voltage, power, and phase associated with the power supply cord at the current sensor.

In one embodiment of the power strip of the present invention, the display device is mounted in the housing of the power strip. Alternatively, a remote cable is provided connectable between the housing of the power strip and an ammeter housing such that the display device is positionable remote from the power strip for displaying the status of the electrical load of the devices connected to the power strip in a convenient location.

The present invention also provides a versatile mounting system for mounting the power strip to a surface. The mounting system improves upon the general configuration of a rectangular cross section of the power strip by providing a T-shaped slot in a rear face, opposite the face which has the female outlets. This T-shaped slot can be used to mount the power strip on conventional screws provided in the cabinet, such that they stand off from the wall in which the strip will be mounted. The T-shaped slot allows the strip to be slid over the heads of a plurality of such screws, following which the screws can be tightened as required.

Alternatively, the power strip having a T-shaped slot or mounting keyway, can be provided with uniquely designed mounting accessories, in the form of brackets, or clips, for use in mounting the power strip, depending upon the needs of a user, in a particular electronic cabinet/enclosure or to other mounting surfaces. One form of bracket useful in mounting the power strip is of Z-shape so as to provide an offset mounting with a Z-bracket coupled to the T-slot.

Another type of mounting bracket is an L-shaped bracket which can be used for mounting the power strip at a right angle relative to a surface to which the L-shaped bracket is mounted.

A swivel bracket is also described, and allows the power strip to be rotated in the cabinet by the user after installation so as to facilitate to an even greater extent the versatility of the mounting to accommodate the user's needs in plugging and unplugging electronic equipment from the power strip.

Finally, a springed mounting clip configuration of generally U-shape is adapted to encircle the rear wall portion of the power strip defining the T-slot, to allow the entire unit to be quickly and easily removed or mounted in the cabinet without need for additional hardware. Accordingly, the T-slot is not utilized with the U-shape mounting clips.

A drop-in clip is also disclosed which when mounted directly on the unit allows the power strip to be installed with a drop-in mounting method, again requiring no additional hardware.

It will be apparent that each cabinet enclosure, equipment rack, or other mounting surface for the power strip will present unique mounting requirements.

Accordingly, the present invention seeks to provide a number of components along with a power strip having a T-shaped slot in the rear face so that the power strip can be mounted in/to a variety of enclosures, racks, and other surfaces so as not to require a skilled artisan for field installation.

Additionally, the present invention provides a power cord including a cable having a male plug connector attached at a first end of the cable and a female plug connector attached at a second end of the cable. One of the male and female plug connectors including a housing having a current sensor mounted therein and connected to the cable for detecting the electrical current flow therethrough. An ammeter housing is provided including a processing circuit and a display device mounted therein for displaying the status of the electrical draw through the power cord at a location remote from the power cord. For example, if the power cord is utilized on a floor or under machinery, the ammeter housing can be positioned in an accessible area for convenient viewing or monitoring of the status of the electrical draw through the power cord.

In another aspect of the present invention, a power cord adapter is provided having a housing including a first side having a male plug connector extending therefrom and a second side having a female plug connector mounted thereto or defined thereby. The male and female plug connectors are electrically connected one to the other via a plurality of wires disposed inside the housing in a conventional manner. A current sensor is mounted in the housing and connected to one of the wires for detecting electrical current flow through the wire and provides an output signal that varies in proportion to the current flow detected. A processing circuit including a display device are coupled to the current sensor for displaying characteristics of the electrical draw through the power cord adapter.

In yet another aspect of the present invention a cabinet for housing electrical equipment is provided. The cabinet having a first side defining an opening for mounting electrical equipment therein and a second side having a power strip in accordance with the present invention removably mounted thereto for providing power to the electrical equipment. The power strip including a remote display device for displaying at least one of the current, voltage, power, and phase associated with the power supply cord at the current sensor. The display device is mounted to the first side of the cabinet such that the electrical draw associated with the power strip can be conveniently viewed from the first side of the cabinet.

The foregoing and still other objects and advantages of the present invention will be more apparent from the detailed explanation of the preferred embodiments of the invention in connection with the accompanying drawings wherein throughout the figures, like reference numerals describe like elements of the invention.

DETAILED DESCRIPTION OF THE PREFERRED EMBODIMENTS

Figure 1:
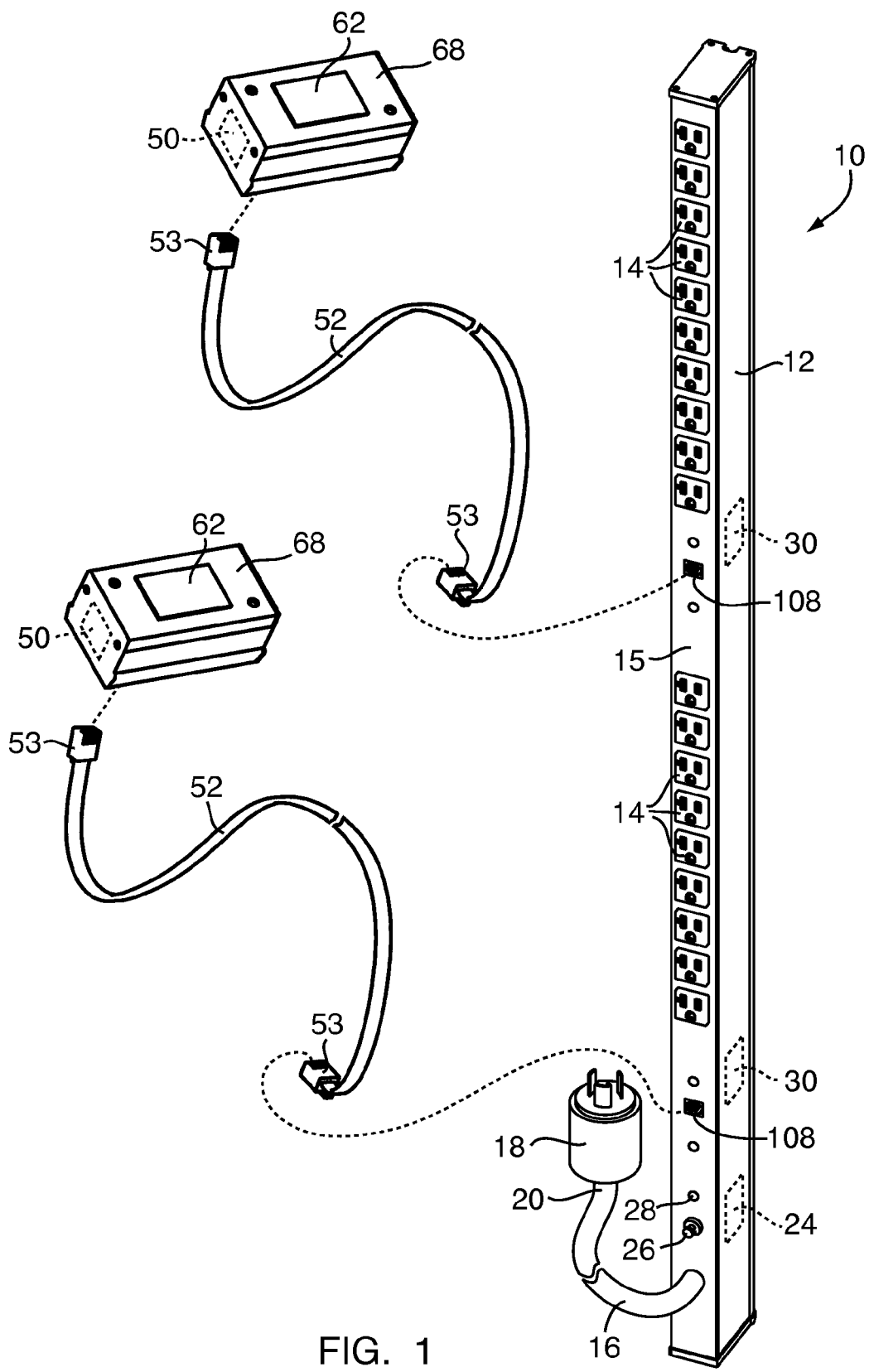
FIG. 1 is a perspective view of a power strip in accordance with the present invention.

Referring to FIG. 1, an exemplary embodiment of a power strip in accordance with the present invention is shown generally at 10. The power strip 10 includes a housing 12 having a plurality of electrical outlets 14 mounted to a front face 15 of the housing. The electrical outlets 14 are electrically connected to a first end portion (not shown) of a power supply cord 16 in a conventional manner for providing electrical power to the outlets. A male plug 18 is attached to a second end 20 of the power supply cord 16. Typically, the male plug 18 is connected to an electrical outlet 76 (shown in FIG. 2) for providing electrical power to the power strip 10.

The power strip 10 includes a circuit breaker 24 also mounted to the front face 15 of the housing 12 and including a reset button 26 and overcurrent indicator 28. The circuit breaker 24 opens in the event of an overcurrent condition and provides overcurrent protection to electrical equipment associated with the power strip 10.

Figure 3:
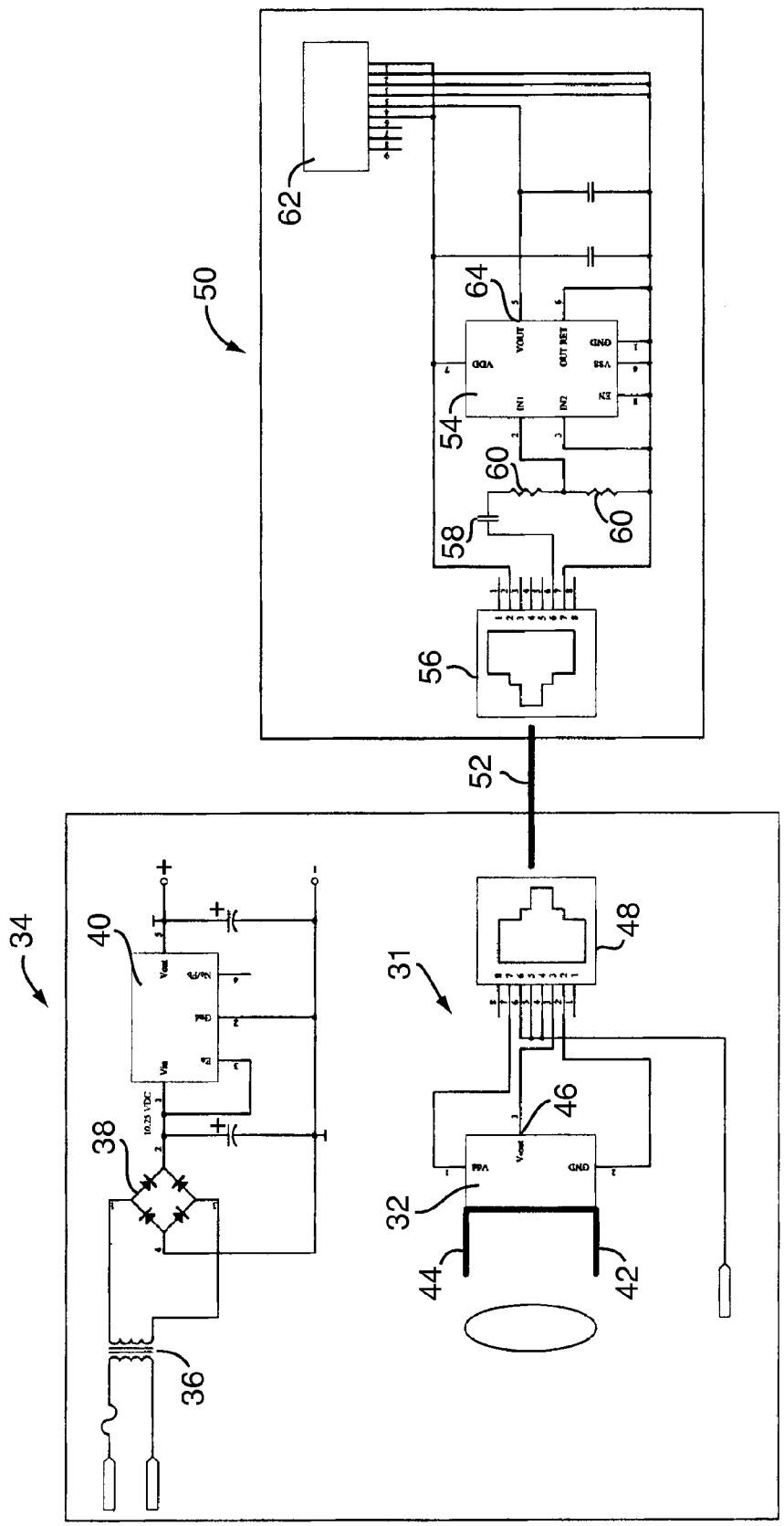
FIG. 3 is a schematic drawing of one embodiment of each of supply, sensing and processing circuits in accordance with the present invention.

Referring to FIGS. 1 and 3, the power strip 10 includes a current sensor module 30 mounted in the housing 12 and including a current sensor 32 (shown in FIG. 3) and a power supply generally referred to by the reference numeral 34. In the FIG. 3 embodiment, the power supply 34 includes a transformer 36 coupled to the power supply cord 16, a rectifier 38 and voltage regulator 40 supplying electrical power, $V_{DD}$=+5 volt to the current sensor 32. In other embodiments of the present invention, the current sensor 32 could be battery powered.

As also shown in FIG. 3, a sensing circuit 31 includes the current sensor 32 having current sensing terminals 42 and 44 connectable to a wire of the power supply cord 16 for detecting the electrical current flow therethrough. Typically, the current sensor 32 includes a Hall effect sensor that detects the current flow through the power supply cord 16 and provides an output voltage proportional thereto at an output terminal 46 of the current sensor. In the FIG. 3 embodiment, an RJ45 connector 48 is coupled to the outputs of the current sensor 32 for connecting the sensing circuit 31 to a processing circuit 50 via a remote cable 52.

In a preferred embodiment of the present invention, the current sensor 32 is an Allegro® MicroSystems, Inc., ACS750 current sensor having a supply voltage Vcc of approximately 5 volts for sensing currents in a range of approximately −50 to +50 Amperes. The output of the Allegro® MicroSystems current sensor has a positive slope (>Vcc/2) when an increasing current flows from the sensing terminal 38 to sensing terminal 36. The Allegro® current sensor provides an electrical offset voltage or quiescent output voltage which is the output of the current sensor when the current flow in the power supply cord 16 is zero equal to Vcc/2 or approximately 2.5 volts. Thus, the current sensor 32 provides an AC output voltage having a first portion proportional to the detected current flow in the power supply cord 16 and a second portion equal to the offset voltage.

Referring again to FIG. 3, the processing circuit 50 includes a processor 54 coupled to the outputs of the current sensor 32 via a coupler 56 that is connectable to an end of the remote cable 52. A capacitor 58 removes a DC component of the output signal of the current sensor 32 and series resistors 60 and 62 divide the amplitude of the output of the current sensor compatibility with and further processing by the processor 54. In the preferred embodiment, the processor 54 includes an RMS to DC converter for converting the AC portion of the output of the current sensor into a proportional DC voltage. In a preferred embodiment, the DC voltage output from the RMS to DC converter is in a range of 0 to 200 mV and is then converted accordingly for displaying of characteristics of the electrical draw associated with the power strip 10 at the current sensor 32. As shown in FIG. 3, a voltmeter and/or display device 62 is coupled to the output 64 of the processor 54 for converting the output of the processor 54 and displaying one of the current, voltage, power and phase of the power supply cord 16 at the current sensor 32. In a preferred embodiment the display device 62 includes a panel DC voltmeter model SP400 made by Lascar Electronics, Inc. of Erie, Pa.

Still referring to FIG. 1, the processing circuit 50 and display device 62 are housed in an ammeter housing 68 that is coupled to current sensor module 30 and the housing 12 via a remote cable 52. The remote cable 52 includes male couplers 53 at the ends thereof for removably connecting the remote cable to the power strip 10 via a female coupler 108. In other embodiments of the power strip 10, the processing circuit 50 and ammeter housing 68 is coupled to the current sensor module 30 via a wireless connection for wireless transmission of the output of the current sensor 32 to the processing circuit 50. Alternatively, the power strip 10 or processing circuit 50 can be coupled to a computer network such as a LAN so that a computer can be utilized for monitoring or analysis of the power utilized by the power strip and devices coupled thereto.

Figure 4:
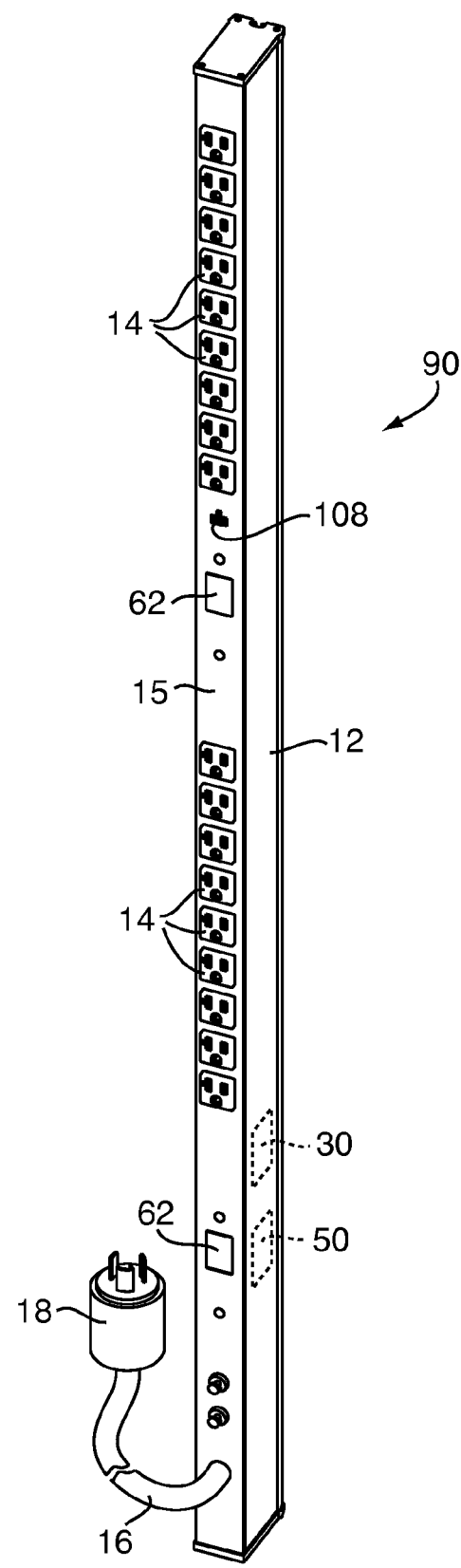
FIG. 4 is a perspective view of another embodiment of a power strip according to the present invention.

FIG. 4 is an illustration of another embodiment of a power strip 90 in accordance with the present invention. The power strip 90 is similar in construction and operation to the power strip 10 of FIG. 1, except that both the processing circuit 50 and display device 62 are mounted inside the housing 12. A female coupler 108 is also provided and mounted to the housing 12 for connecting an additional remote ammeter housing 68 including a processing circuit 50 to the output of the current sensor module 30.

Figure 2:
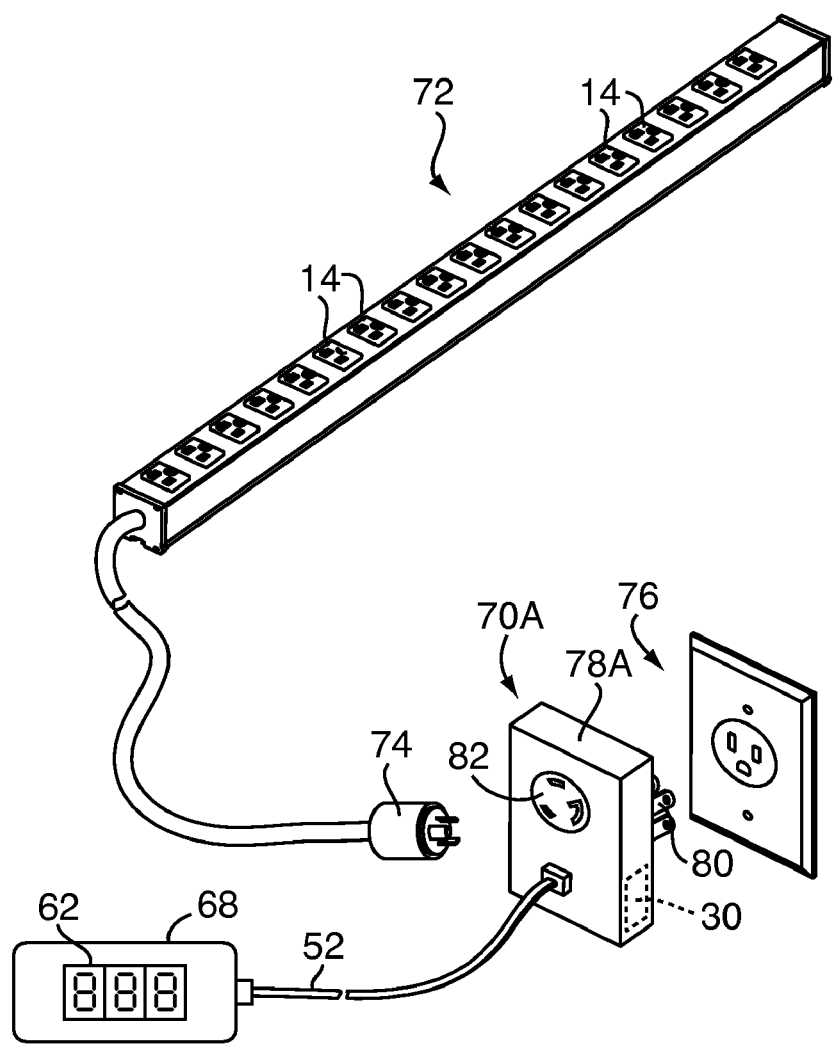
FIG. 2 is an exploded perspective view of a power cord adapter according to the present invention shown as connectable between a conventional power strip and a wall outlet.

Referring to FIG. 2, the present invention provides a power cord adapter, generally referred to by the reference number 70A. As shown in FIG. 2, the power cord adapter 70A is connectable between a conventional power strip 72 having a male plug 74 and an electrical outlet, generally referred to as 76. The power cord adapter 70A includes a housing 78A having a male plug 80 extending from a first side of the housing and a female plug connector 82 mounted to another side of the housing. The male and female plug connectors 80 and 82 are electrically coupled one to the other via a plurality of wires disposed inside the housing 78A in a conventional manner. In the FIG. 2, configuration, the power cord adapter 70A monitors the electrical draw of the power strip 72 at the male plug 74. A current sensor module 30 including a current sensor 32 are mounted in the housing 78A for electrical connection with at least one wire coupled to the male plug 74. The ammeter housing 68 houses the processing circuit 50 and display device 62 and is coupled to the current sensor module 30 via the remote cable 52. The operation of the current sensor module 30 and processing circuit 50 are the same as set forth above with respect to the power strip 10. Accordingly, the power cord adapter 70A is compatible with any power strip or power cord for monitoring and displaying the electrical draw of appliances coupled thereto.

Figure 6:
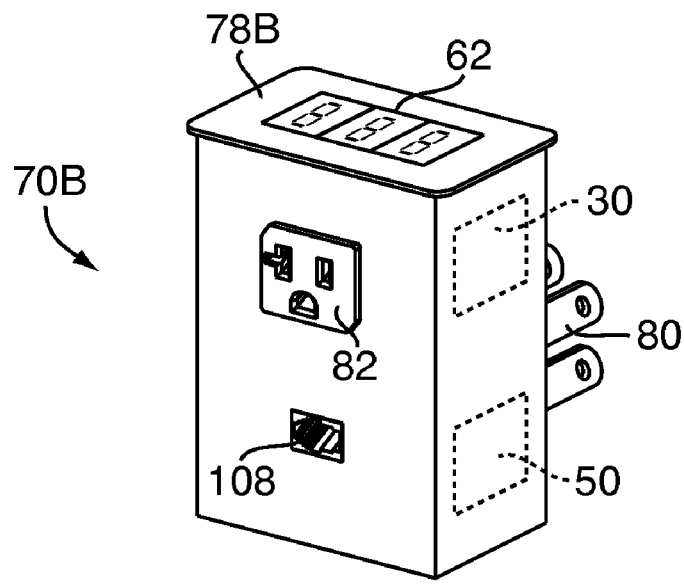
FIG. 6 is a perspective view of another embodiment of a power cord adapter according to the present invention.

FIG. 6 shows a power cord adapter 70B according to the present invention that is similar to the power cord adapter 70A of FIG. 2 wherein the housing 78B includes the processing circuit 50 and display device 62 mounted therein. A coupler 108 is provided connected to the processing circuit 50 for connecting an additional remote voltmeter and/or display device 62 to the power cord adapter 70B.

Figure 7:
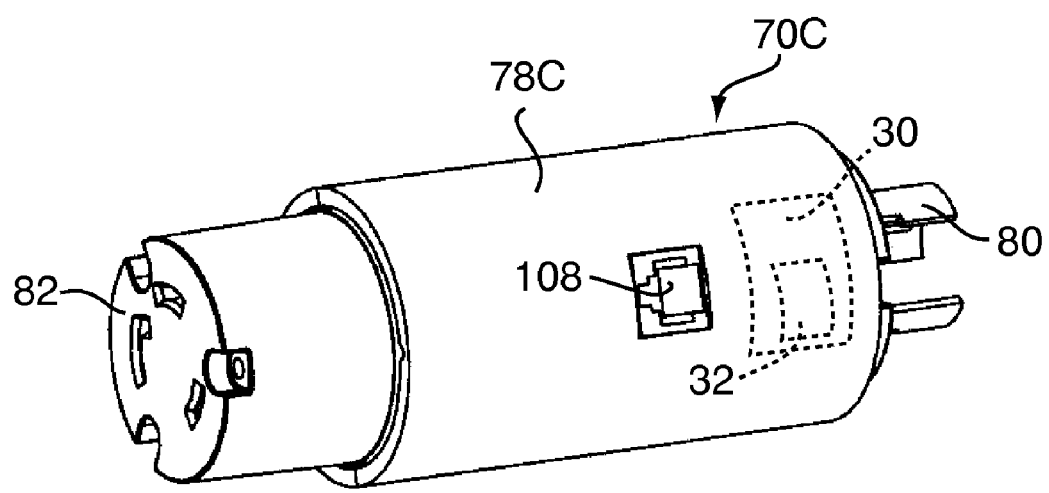
FIG. 7 is a perspective view of yet another embodiment of a power cord adapter according to the present invention.

Referring to FIG. 7, another embodiment of a power cord adapter in accordance with the present invention is generally referred to by the reference numeral 70C. The power cord adapter 70C includes a housing 78C having a male plug 80 and female plug connector 82 mounted at opposing ends of the housing. The power cord adapter 70C includes a plurality of wires disposed inside the housing 78C and electrically connecting the male and female plug connectors 80 and 82 respectively, in a typical fashion known in the art. A current sensor module 30 is mounted interior the housing 78C and includes a current sensor 32 coupled to one of the wires coupling the male and female plugs 80, 82 together for detecting the electrical current flow therethrough as described above. A coupler 108 is mounted to the housing 78C and electrically connected to the output of the current sensor 32 for connecting a processing circuit 50 including a remote voltmeter and/or display device 62 to the power cord adapter 70C.

Figure 5:
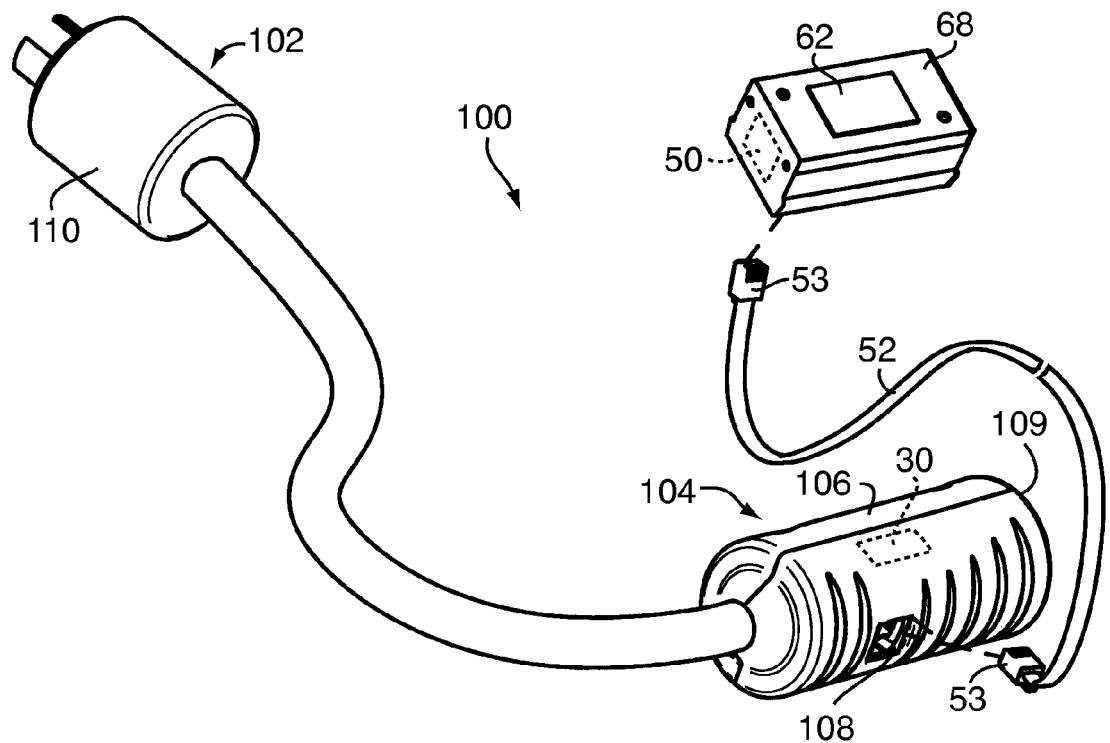
FIG. 5 is a perspective view of a power cord and remote ammeter in accordance with the present invention.
Figure 5A:
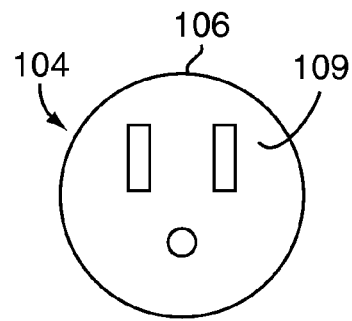
FIG. 5A is an end view of the power cord of FIG. 5.

Referring to FIG. 5 a power cord 100 in accordance with the present invention includes opposing male and female plug ends, generally 102 and 104 respectively. The female plug end 104 is coupled to one end of the power cord 100 and includes a plug housing 106 having a female plug connector 109 and current sensor module 30 mounted therein. The female plug connector 109 (shown in FIG. 5A) is electrically connected to one end of the power cord 100 as is known in the art. The current sensor module 30 includes a current sensor 32 (shown in FIG. 3) electrically connected to a wire of the power cord 100 as set forth above with respect to the power cord 16 of FIG. 1. A female coupler 108 is mounted to the plug housing 106 and coupled to the current sensor 32 for connecting the current sensor to a remote ammeter housing 68 via a remote cable 52 and coupler 53 as discussed hereinabove with respect to the power strip 10 of FIG. 1. As shown in FIG. 5, the remote ammeter housing 68 includes a display device 62 for displaying characteristics of the electrical draw of appliances coupled to the power cord 100 at the female plug end 104 as detected by the current sensor 32. In other embodiments of the power cord 100, the current sensor module 30 can be mounted in a housing 110 at the male plug end 102 for monitoring the electrical draw at the male plug end 102 and a power source coupled thereto.

Figure 8:
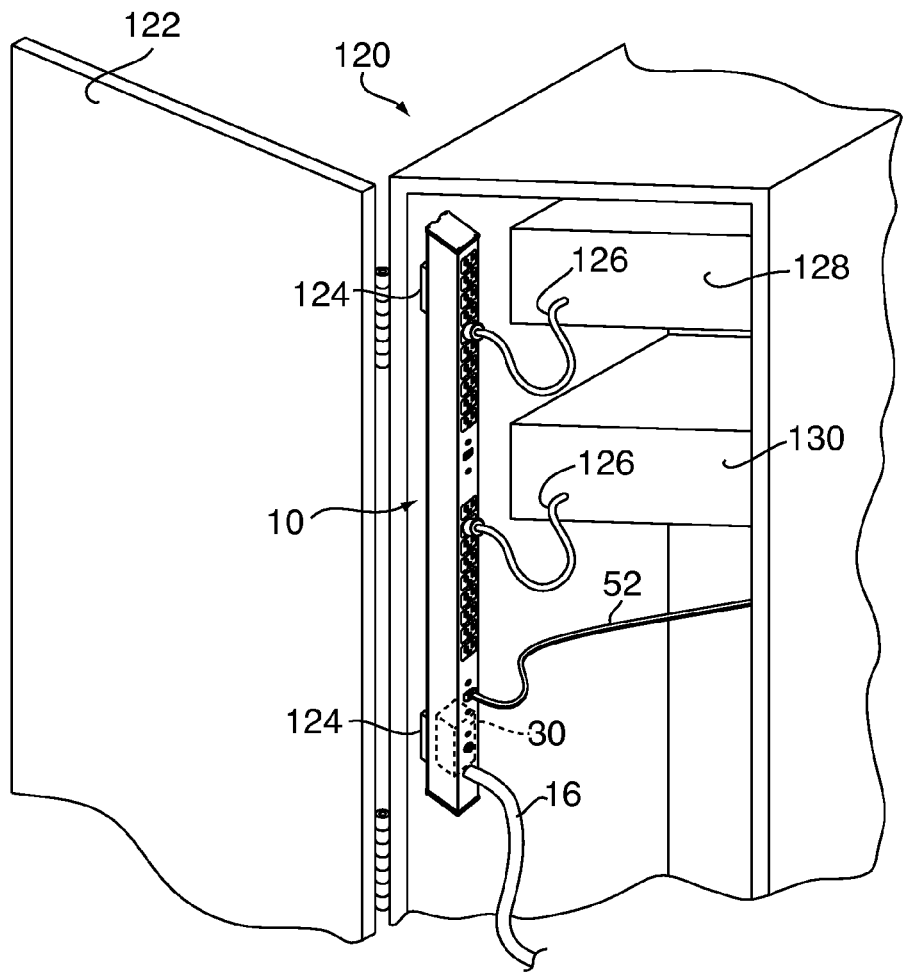
FIG. 8 is a partial perspective view of a rear side of a cabinet for storing electrical equipment in accordance with the present invention.

FIG. 8 shows a cabinet for housing electrical equipment according to the present invention generally referred to by the reference numeral 120. The cabinet 120 includes a rear access door 122, the door being shown in an open position so as to reveal the interior of the cabinet from a rear side. A power strip 10 in accordance with the present invention is mounted on swivel brackets 124, allowing the power strip to be rotated relative to the cabinet in order to facilitate plug-in connections between power cords 126 for the equipment 128, 130 and the power strip. The power strip 10 includes a power cord 16 as described above, which is connectable to a source of power by conventional means.

Figure 9:
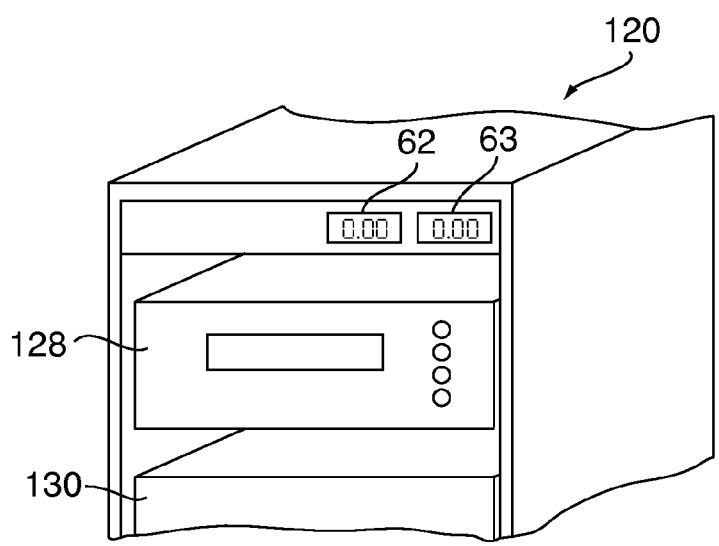
FIG. 9 is a partial perspective view of a front side of the cabinet of FIG. 8.

As shown in FIG. 9, a front side of the cabinet 120 provides access to the electrical equipment 128, 130 mounted therein. A display device 62 and/or remote ammeter/voltmeter 63 is mounted to the front side of the cabinet 120 for viewing from the front side of the cabinet. The ammeter/voltmeter 63 may be of analog variety, but preferably is a digital device.

Figure 10:
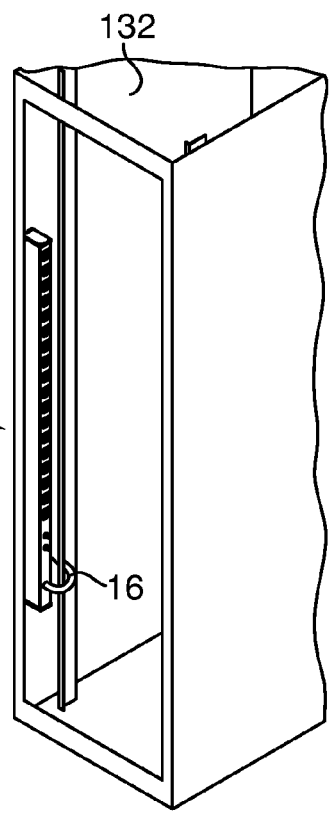
FIG. 10 is a partial perspective view of the rear side of another embodiment of a cabinet for storing electrical equipment in accordance with the present invention.

The display device 62 and/or remote ammeter/voltmeter 63 is coupled to the power strip 10 via the remote cable 52 and is operable in conjunction with a processing circuit 50 as set forth above. The processing circuit 50 can be housed either in the housing 12 of the power strip 10 or within the ammeter housing 68 as discussed above. FIG. 10 is an illustration of the cabinet 120 without the rear access door 122 to show the power cord 16 as arranged to exit the cabinet through a side wall 132 of the cabinet.

Figure 11:
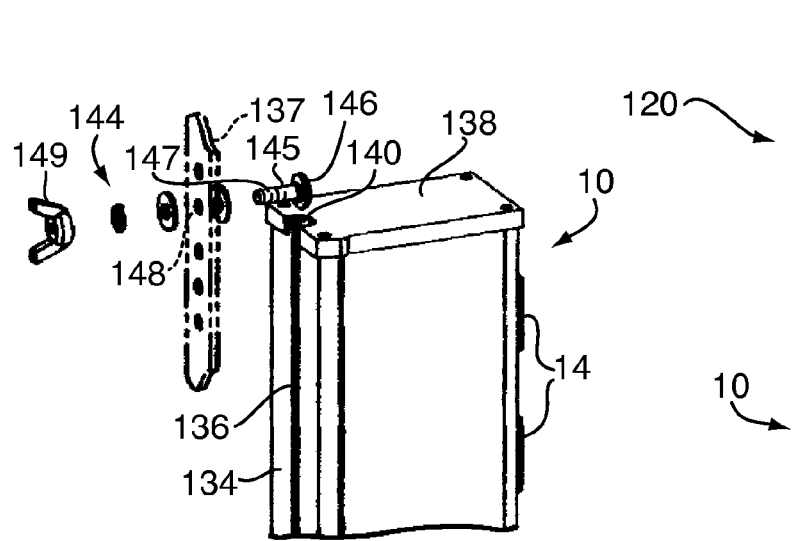
FIG. 11 is a perspective view of the rear side of a power strip according to the present invention including a T-slot for mounting the power strip to a surface.

Referring to FIG. 11, a rear side 134 of the power strip 10 defines a T-slot 136 for mounting the power strip 10 to a surface 137 shown in dashed lines. An end cap 138 of the power strip 10 defines a T-slot 140 corresponding to the T-slot 136 defined by the rear side 134 of the power strip. The surface 137 represents any surface the power strip 10 is mounted to such as the sidewall 132 of the cabinet 120. A bolt and nut fastener assembly generally referred to by the reference number 144 couples the power strip 10 to the surface 137. As shown in FIG. 11, the fastener assembly 144 includes a bolt 145 having a head 146 that is receivable in the T-slot 134 and a threaded portion 147 that extends outwardly from the T-slot 134 and through a corresponding mounting hole 148 defined by the surface 137. A nut 149 threadably secureable to the threaded portion 147 of the bolt 145 secures the power strip 10 to the surface 137. As shown in FIG. 11, and is common in the art, flat washers, lock washers, lock nuts, or other types of fasteners and accessories can be used with the bolt 145 or substituted therefor. Accordingly, as arranged in FIG. 11, the power strip 10 is slidable along the T-slot relative to the surface 137 by loosening the fastener assembly 144.

Figure 12:
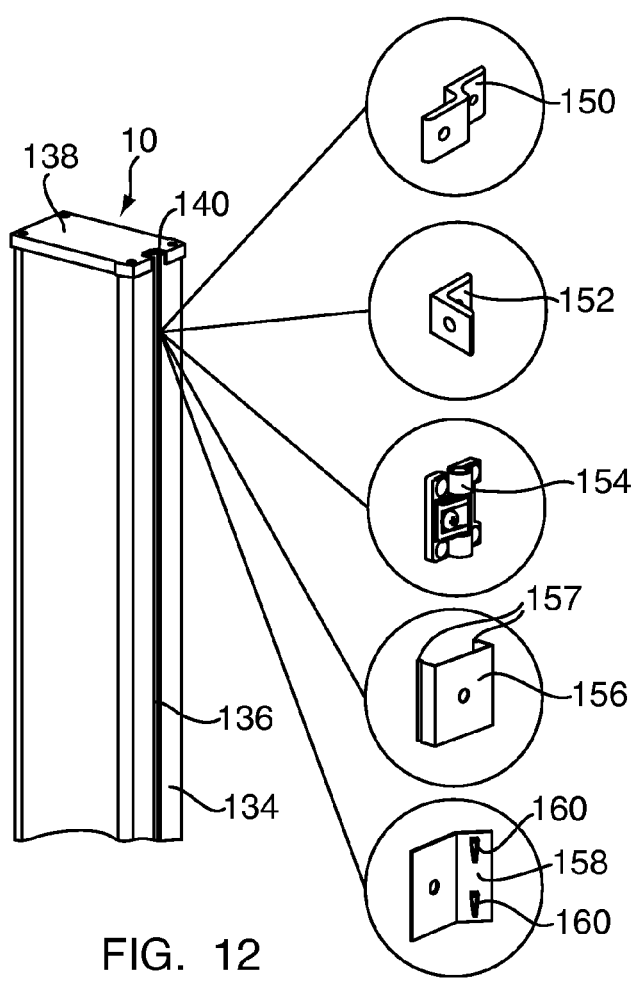
FIG. 12 is a perspective view of a rear side of the power strip of FIG. 11 shown with a plurality of corresponding mounting brackets in accordance with the present invention.

FIG. 12 shows the power strip 10 having a T-slot 136 defined at a rear side 134 thereof. Also shown in FIG. 6 is a plurality of mounting brackets that can be used for mounting the power strip 10 in various applications including mounting the power strip 10 inside of an electronic cabinet 120.

Alternatively, and as supplied by the manufacturer of the power strip 10 in the form of a kit, mounting accessories are provided with the understanding that each cabinet, enclosure, rack or other application is unique, and might require different solutions for mounting the power strip to the enclosure or frame of the individual unit which is to be equipped with a power strip in accordance with the present invention.

Referring again to FIG. 12, a Z-bracket 150 is illustrated which is designed to offset the power strip 10 in order to afford improved access to the front face 15 of the power strip and to the female outlets 14 provided therein, as well as to the circuit breakers 24 which are generally also provided in the front face of the power strip.

Also, provided by the manufacturer of the power strip 10, are L-brackets 152 which allow mounting of the power strip at a right angle to a surface. For example, the L-brackets 152 are useful to mount the power strip 10 to a sidewall 132 of the cabinet 120 such that the front face 15 of the power strip 10 can be mounted facing the rear of the cabinet to provide better access to the female outlets 14 mounted thereto.

Even more versatile are the swivel brackets 154 provided by the power strip manufacturer and illustrated in FIG. 12 that will allow the power strip 10 to be rotated through approximately 270° depending upon its location within the cabinet or other structure to which the power strip is mounted, thereby providing ready access to the front face 15 of the power strip 10.

Spring clip 156, are also provided which are mountable to a surface 137 and provide clip portions 157 between which the rear face 134 of the power strip 10 is engageable, without requiring the T-slot 136. The spring clips 156 provide for the removal and replacement of the power strip 10 without the need for tools.

Drop-in clips 158 are also provided and include key-hole slots 160 to allow the power strip 10 to be installed in a "drop and hold" assembly, again requiring no tools.

While exemplary embodiments of the present invention have been shown and described, various modifications and substitutions may be made thereto without departing from the spirit and scope of the invention. Accordingly, it is to be understood that the present invention has been described by way of illustration and not limitation.

What is claimed is:

1. A power strip comprising:
    a housing coupled to a first end portion of a power supply cord, the housing having at least one electrical receptacle mounted thereto and electrically connected to the first end portion of the power supply cord, the power supply cord having a second end connectable to a power source;
    a current sensor coupled to the first end portion of the power supply cord between the at least one electrical receptacle and the second end, the current sensor for detecting electrical current flow through the power supply cord and providing an output signal that varies in proportion to the current flow through the power supply cord;
    a processing circuit coupled to the output of the current sensor and including means for processing the output signal of the current sensor for displaying characteristics of the electrical current flow detected in the power supply cord, the processing circuit coupled to a display device, the display device for displaying at least one of the current, voltage, power, and phase associated with the power supply cord at the current sensor; and
    a remote cable coupled between the output of the current sensor and an input of the processing circuit such that the processing circuit and the display device are positionable remote from the housing.

2. The power strip according to claim 1 further comprising a sensor circuit including the current sensor and a power supply electrically connected to the current sensor and the first end portion of the power supply cord, the power supply for providing electrical power to the current sensor.

3. The power strip according to claim 1 wherein the sensor circuit and the processing circuit include terminals for removably coupling the remote cable therebetween.

4. The power strip according to claim 3 wherein the terminals include RJ45 connectors.

5. The power strip according to claim 1 wherein the current sensor includes a Hall effect current sensor.

6. The power strip according to claim 1 wherein the output signal of the current sensor includes an output voltage and the processing circuit includes means for converting the output voltage to a DC voltage proportional to the electrical current flow detected in the power supply cord.

7. The power strip according to claim 6 wherein the means for converting the output voltage of the current sensor to a DC voltage includes an RMS to DC converter.

8. The power strip according to claim 1 further comprising an ammeter housing wherein the processing circuit and the display device are housed in the ammeter housing.

9. The power strip according to claim 1 wherein the output voltage of the current sensor includes a quiescent portion and a variable portion, the variable portion corresponding to the current flow detected in the power supply cord.

10. The power strip according to claim 1 further comprising a male plug coupled to the second end of the power supply cord for connecting the power supply cord to a power source.

11. The power strip according to claim 1 wherein the housing further comprises a T-slot defined in a surface thereof for mounting the housing to a surface.

12. A power strip comprising:
a housing coupled to a first end portion of a power supply cord, the housing having at least one electrical receptacle mounted thereto and electrically connected to the first end portion of the power supply cord, the power supply cord having a second end connectable to a power source;
a current sensor coupled to the first end portion of the power supply cord between the at least one electrical receptacle and the second end, the current sensor for detecting electrical current flow through the power supply cord and providing an output signal that varies in proportion to the current flow through the power supply cord;
a processing circuit coupled to the output of the current sensor and including means for processing the output signal of the current sensor for displaying characteristics of the electrical current flow detected in the power supply cord, the processing circuit coupled to a display device, the display device for displaying at least one of the current, voltage, power, and phase associated with the power supply cord at the current sensor; and
a wireless transmitter coupled to the output of the current sensor for wireless transfer of the output signal of the current sensor to the processing circuit wherein processing circuit and the display device are positionable remote from the housing.

13. The power strip according to claim 12 further comprising an ammeter housing wherein the processing circuit and the display device are housed in the ammeter housing.

14. A power cord comprising:
a multiple wire cable including a first end having a male plug connector attached thereto and a second end having a female plug connector attached thereto;
one of the male and female plug connectors including a housing having a current sensor mounted therein, the current sensor coupled to a wire of the cable between the male and female plug connectors, the current sensor for detecting electrical current flow through the cable and providing an output signal that varies in proportion to the current flow;
a processing circuit coupled to the output of the current sensor and including means for processing the output signal of the current sensor for displaying characteristics of the electrical current flow detected in the cable, the processing circuit coupled to a display device, the display device for displaying at least one of the current, voltage, power, and phase associated with the power cord at the current sensor;
a remote cable connected between an output of the current sensor and the processing circuit such that the display device can be positioned at a location remote from the power cord.

15. The power cord according to claim 14 further comprising an ammeter housing wherein the processing circuit and the display device are disposed in the ammeter housing.

16. The power cord according to claim 14 wherein the remote cable is removably connectable between the housing of the one of the male and female plug connectors and the ammeter housing.

17. The power cord according to claim 14 wherein the current sensor includes a Hall effect current sensor.

18. The power cord according to claim 14 wherein the output signal of the current sensor includes an output voltage and the processing circuit includes means for converting the output voltage to a DC voltage proportional to the electrical current flow detected in the power supply cord.

19. The power cord according to claim 18 wherein the means for converting the output voltage of the current sensor to a DC voltage includes an RMS to DC converter.

20. The power cord according to claim 14 further comprising means for wireless transfer of the output signal of the current sensor to the processing circuit such that the display device is positionable remote from the power cord.

21. A power cord adapter comprising:
a housing having first and second ends;
a male plug connector extending from the first end of the housing;
a female plug connector mounted to the second end of the housing;
a plurality of wires electrically connecting the male and female plug connectors one to the other and disposed in the housing;
a current sensor mounted in the housing and coupled to one of the wires between the male and female plug connectors, the current sensor for detecting electrical current flow through the one of the wires and having an output terminal providing an output signal that varies in proportion to the current flow;
a first electrical coupler mounted to the housing and connected to the output terminal of the current sensor;
a processing circuit having an input connected to a second electrical coupler and including means for converting the output voltage of the current sensor to a DC voltage proportional to the electrical current flow detected in the cable coupled to a display device, the display device for displaying at least one of the currents, voltage, power, and phase associated with the cable at the current sensor;
a remote cable removably connectable between the first and second electrical couplers for transferring the output of the current sensor to the processing circuit such that the display device can be positioned at a location remote from the cable.

22. The power cord according to claim 21 wherein the first and second electrical couplers include RJ45 connectors.

23. The power cord according to claim 21 further comprising an ammeter housing wherein the processing circuit and the display device are disposed in the ammeter housing.

24. A power cord adapter comprising:
a housing having first and second ends;
a male plug connector extending from the first end of the housing;
a female plug connector defined by the second end of the housing;
a plurality of wires electrically connecting the male and female plug connectors one to the other and disposed in the housing;
a current sensor mounted in the housing and coupled to one of the wires between the male and female plug connectors, the current sensor for detecting electrical current flow through the one of the wires and having an output terminal providing a voltage that varies in proportion to the current flow therethrough;

a processing circuit coupled to the output of the current sensor and including means for converting the output voltage of the current sensor to a DC voltage proportional to the electrical current flow detected in the one of the wires coupled to a display device, the display device for displaying at least one of the current, voltage, power, and phase associated with the one of the wires at the current sensor;

the display device mounted in the housing.

25. The power cord adapter according to claim 24 wherein the housing further comprises a connector coupled to an output of the processing circuit for coupling a remote display device thereto.

26. A cabinet for housing electrical equipment comprising:

a first side defining at least one opening for mounting electrical equipment therein;

a second side having a power strip removably mounted thereto for providing power to the electrical equipment;

the power strip including a housing coupled to a first end portion of a power supply cord, the housing having at least one electrical receptacle mounted thereto and electrically connected to the first end portion of the power supply cord, the power supply cord having a second end extendable outwardly from the second side of the cabinet and connectable to a power source;

a current sensor mounted in the housing and coupled to the first end portion of the power supply cord between the at least one electrical receptacle and the second end, the current sensor for detecting electrical current flow through the power supply cord and having an output providing a voltage that varies in proportion to the current flow through the power supply cord;

a processing circuit coupled to the output of the current sensor and including means for converting the output voltage of the current sensor to a DC voltage proportional to the electrical current flow detected in the power supply cord coupled to a display device, the display device for displaying at least one of the current, voltage, power, and phase associated with the power supply cord at the current sensor; and wherein the display device is mounted to the first side of the cabinet.

27. The cabinet according to claim 26 further comprising a remote cable coupled between the output terminal of the current sensor and the processing circuit wherein both of the processing circuit and the display device are positionable at a location remote from the power strip.

28. The cabinet according to claim 27 further comprising an ammeter housing wherein the processing circuit and the display device are disposed in the ammeter housing, the ammeter housing being mounted to the cabinet such that the display device is viewable from the first side of the cabinet.

29. The cabinet according to claim 26 wherein the housing includes a surface defining a T-slot for removably mounting the power strip to a surface of the cabinet.

* * * * *